United States Patent
Espinoza et al.

(10) Patent No.: US 6,898,543 B2
(45) Date of Patent: May 24, 2005

(54) IN-SYSTEM TESTING OF AN OSCILLATOR

(75) Inventors: Juan A. Espinoza, Wake Forest, NC (US); L. Grant Giddens, Raleigh, NC (US); Clark Tollerson, Raleigh, NC (US)

(73) Assignee: ADC DSL Systems, Inc., Eden Prairie, MN (US)

(*) Notice: Subject to any disclaimer, the term of this patent is extended or adjusted under 35 U.S.C. 154(b) by 48 days.

(21) Appl. No.: 10/201,512

(22) Filed: Jul. 23, 2002

(65) Prior Publication Data

US 2004/0019449 A1 Jan. 29, 2004

(51) Int. Cl.[7] .................... G06F 19/20; H04M 1/24
(52) U.S. Cl. .................. 702/117; 375/316; 702/60; 702/85
(58) Field of Search .................. 702/60, 85, 107, 702/117–120, 124; 701/33; 324/277; 368/113, 118; 342/410; 370/506; 375/316, 346; 327/153, 277, 543; 714/744

(56) References Cited

U.S. PATENT DOCUMENTS

| | | | |
|---|---|---|---|
| 5,231,314 A | * | 7/1993 | Andrews .................... 327/153 |
| 5,430,659 A | * | 7/1995 | Miller ........................ 702/124 |
| 5,652,712 A | * | 7/1997 | Szczebak et al. ............. 702/85 |
| 5,859,878 A | * | 1/1999 | Phillips et al. .............. 375/316 |
| 5,983,014 A | * | 11/1999 | Shay .......................... 702/60 |
| 6,622,106 B2 | * | 9/2003 | Rocchi et al. .............. 702/107 |

* cited by examiner

*Primary Examiner*—John Barlow
*Assistant Examiner*—John Lee
(74) *Attorney, Agent, or Firm*—Fogg & Associates, LLC; Scott V. Lundberg

(57) ABSTRACT

Testing an oscillator and other electronic devices on a circuit board. One method of the present invention comprises powering the oscillator. Providing test instructions to a microprocessor on the circuit board to place the microprocessor in a test mode. Receiving a clock signal from the oscillator at a multiplexer in a field programmable gate array. Receiving operating instructions at the multiplexer from the microprocessor. Multiplexing the clock signal to an external access port with the multiplexer in response to the operating instructions and measuring the frequency of the clock signal at the external access port.

24 Claims, 3 Drawing Sheets

IN-SYSTEM TESTING OF AN OSCILLATOR

TECHNICAL FIELD

The present invention relates generally to the field of electronic module testing and in particular a device for testing an oscillator and other electronic devices in a clock signal path on a circuit board.

BACKGROUND

A typical method of testing electronic devices coupled to an electronic module or circuit board is with the use of a test fixture. The test fixture typically has a bed of nails (spring probes) upon which the circuit board is mounted for testing. The spring probes make electrical contact with test points (access pins or ports) on the circuit board. In operation, the test fixture applies select signals to a select test point on the circuit board and monitors a response to the select signals at another select test point of the circuit board. Approximately 80 to 90 percent of the electronic devices on the circuit board can be tested with a typical test fixture.

The testing of a clock (or oscillator) on a circuit board is typically done by applying power to a select test point that is electrically coupled to the oscillator and taking a frequency measurement at another test point that is coupled to an output of the oscillator. If the frequency measured is a frequency that is expected, the oscillator is verified as working. However, if the measured frequency is not what is expected, the oscillator is not working properly.

Test fixtures are very expensive to purchase. Moreover, economically it is difficult to justify purchasing a test fixture if the volume of circuit boards produce is relatively low. In addition, the cost is doubled if the manufacture of the circuit boards takes place in two different locations and the testing needs to take place at both locations. It is desired in the art to have an efficient, non-expensive method of testing an oscillator on a circuit board.

For the reasons stated above, and for other reasons stated below which will become apparent to those skilled in the art upon reading and understanding the present specification, there is a need in the art for an improved method of testing an oscillator on a circuit board.

SUMMARY

The above-mentioned problems as well as other problems are addressed by embodiments of the present invention and will be understood by reading and studying the following description.

In one embodiment, a method of testing an oscillator on a circuit board is disclosed. The method comprises powering the oscillator. Providing test instructions to a microprocessor on the circuit board to place the microprocessor in a test mode. Receiving a clock signal from the oscillator at a multiplexer in a field programmable gate array. Receiving operating instructions at the multiplexer from the microprocessor. Multiplexing the clock signal to an external access port with the multiplexer in response to the operating instructions and measuring the frequency of the clock signal at the external access port.

In another embodiment, a method for testing a signal generator for a circuit on a circuit board is disclosed. The method comprises powering the signal generator. Initiating a test mode for the circuit and in the test mode, selectively passing a signal from the signal generator to a port of the circuit for testing the signal form the signal generator.

In yet another embodiment, a method of testing electronic devices on a circuit board with a clock signal. The method comprises coupling a clock signal to a microprocessor. Coupling a test signal to the microprocessor. Passing operation instructions and the clock signal to a multiplexer in response to the test signal. Multiplexing the clock signal through the multiplexer to an external access port in response to the operation instructions and measuring the frequency of the clock signal at the external access port.

In further another embodiment, a tester for testing an oscillator on a circuit board is disclosed. The tester comprises a tester function that is adapted to transmit a test signal containing test instructions to a microprocessor on the circuit board, wherein the test instructions instruct the microprocessor to pass a clock signal formed by the oscillator to a multiplexer and to further instruct the multiplexer to multiplex the clock signal to an external access port.

In further yet another embodiment, a circuit board testing system is disclosed. The testing system comprises an external tester, a circuit board and a measuring device. The external tester is adapted to generate test instructions. The circuit board comprises a microprocessor, an oscillator, a field programmable array (FPGA) and a multiplexer. The microprocessor is selectively coupled to receive the test instructions from the external tester, wherein the microprocessor goes into a test mode upon receiving the test instructions from the external tester. The oscillator provides a clock signal. The field FPGA provides operational functions of the circuit board. The multiplexer is contained in the FPGA. The multiplexer is coupled to receive the clock signal as well as operational instructions from the microprocessor when the microprocessor is in the test mode. The multiplexer multiplexes the clock signal to an external access port in response to receiving the operational instructions from the microprocessor. The measuring device is selectively coupled to the external access port to measure the frequency of the clock signal at the external access port. If the frequency of the clock signal at the external access port matches an expected frequency the oscillator is verified as working properly.

In still another embodiment, an electronic module with testing functionality is disclosed. The electronic module comprises a microprocessor, a signal source, a functional circuit and a multiplexer. The microprocessor is adapted to receive test instructions from an external tester. The microprocessor goes into a test mode upon receiving the test instructions from the external tester. The signal source is coupled to the microprocessor to provide a signal. The functional circuit is operatively coupled to the microprocessor to provide operation functions of the electronic module in non-test modes. The multiplexer is contained in the functional circuit and is adapted to receive the signal from the microprocessor. The multiplexer is further coupled to receive operation instructions from the microprocessor when the microprocessor is in the test mode. Moreover, the multiplexer multiplexes the signal to an external access port in response to receiving the operational instructions from the microprocessor in test mode.

BRIEF DESCRIPTION OF THE DRAWINGS

The present invention can be more easily understood and further advantages and uses thereof more readily apparent, when considered in view of the description of the preferred embodiments and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention allows for the testing of an oscillator on a circuit board without the use of a test fixture. In particular, embodiments of the present invention test the oscillator (or generator), as well as other electronic devices of the circuit board, by passing a clock signal from the oscillator through the other electronic devices of the circuit board and then measuring the frequency of the clock signal at an already existing access point on the circuit board. The tests used in the embodiments of the present invention can occur even when the circuit board that contains the oscillator is mounted in its normal operational location. That is, testing of the oscillator using embodiments of the present invention does not require the attachment of the circuit board to a bed of nails in a test fixture.

Figure 1A:
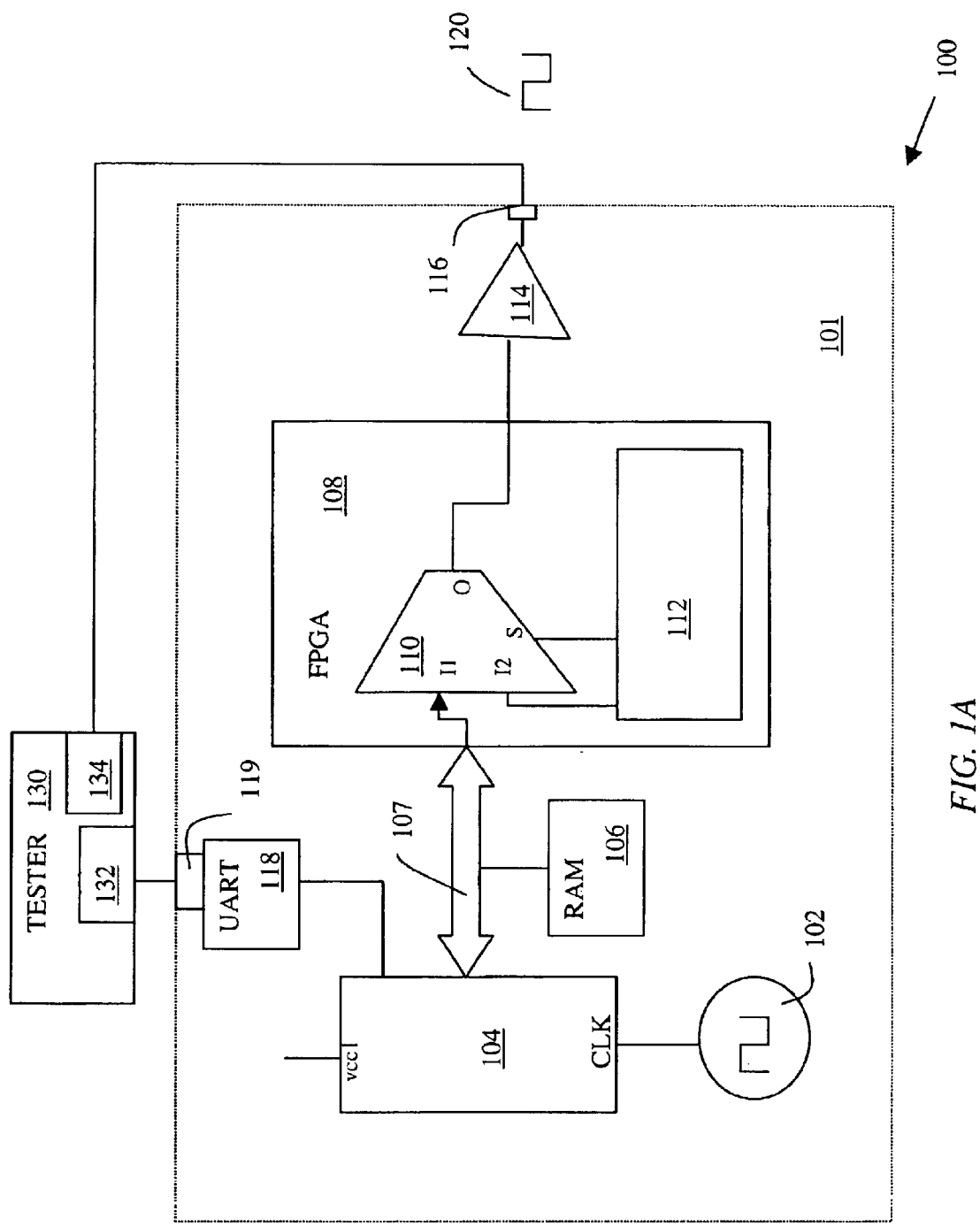
FIG. 1A is a block diagram of testing system according to one embodiment of the present invention.

Referring to FIG. 1A, one embodiment of an oscillator testing system 100 of the present invention is illustrated. As illustrated, the oscillator testing system 100 includes a circuit board 101 and a tester 130. In particular, in the embodiment of FIG. 1, generally only the electronic devices on the circuit board 101 that focus on this embodiment of present invention are illustrated. The electronic devices include an oscillator 102, a microprocessor 104, a random access memory (RAM) 106, a system bus 107, a field programmable array (FPGA) 108 (or application specific integrated circuit 108), a buffer 114, an access port 116, a universal asynchronous receiver/transmitter (UART) 118, and a UART port 119. The FPGA typically performs the functions of the circuit board 101 and is electrically coupled to an external port. The FPGA 108 includes logic circuit 112. In particular, logic circuit 112 includes all of the circuits typically used in forming a FPGA 108. In addition, the FPGA 108 is illustrated as including multiplexer (MUX) 110.

In embodiments of the present invention, normal activation power is supplied to oscillator 102. Oscillator 102 produces a clock signal used to clock the microprocessor 104 in response to the activation power. Tester 130 is coupled to the UART port 119 to supply test instructions to the microprocessor 104 via the UART 118. In response to the instructions, the microprocessor 104 enters into a test mode and passes the clock signal through the system bus 107 to MUX 110 of the FPGA 108 along with instructions to MUX 110. In response to the instructions, MUX 110 passes the clock signal to buffer 114. Buffer 114 is used to change voltage levels. In particular, buffer 114 in this embodiment is an output buffer 114 that provides a passageway to access port 116. Access port 116, in one embodiment, is an existing input/output pin. In other embodiments, in which a passageway to an external port does not flow through a buffer, a buffer is not required. The frequency of the clock signal is measured at access port 116.

Figure 1B:
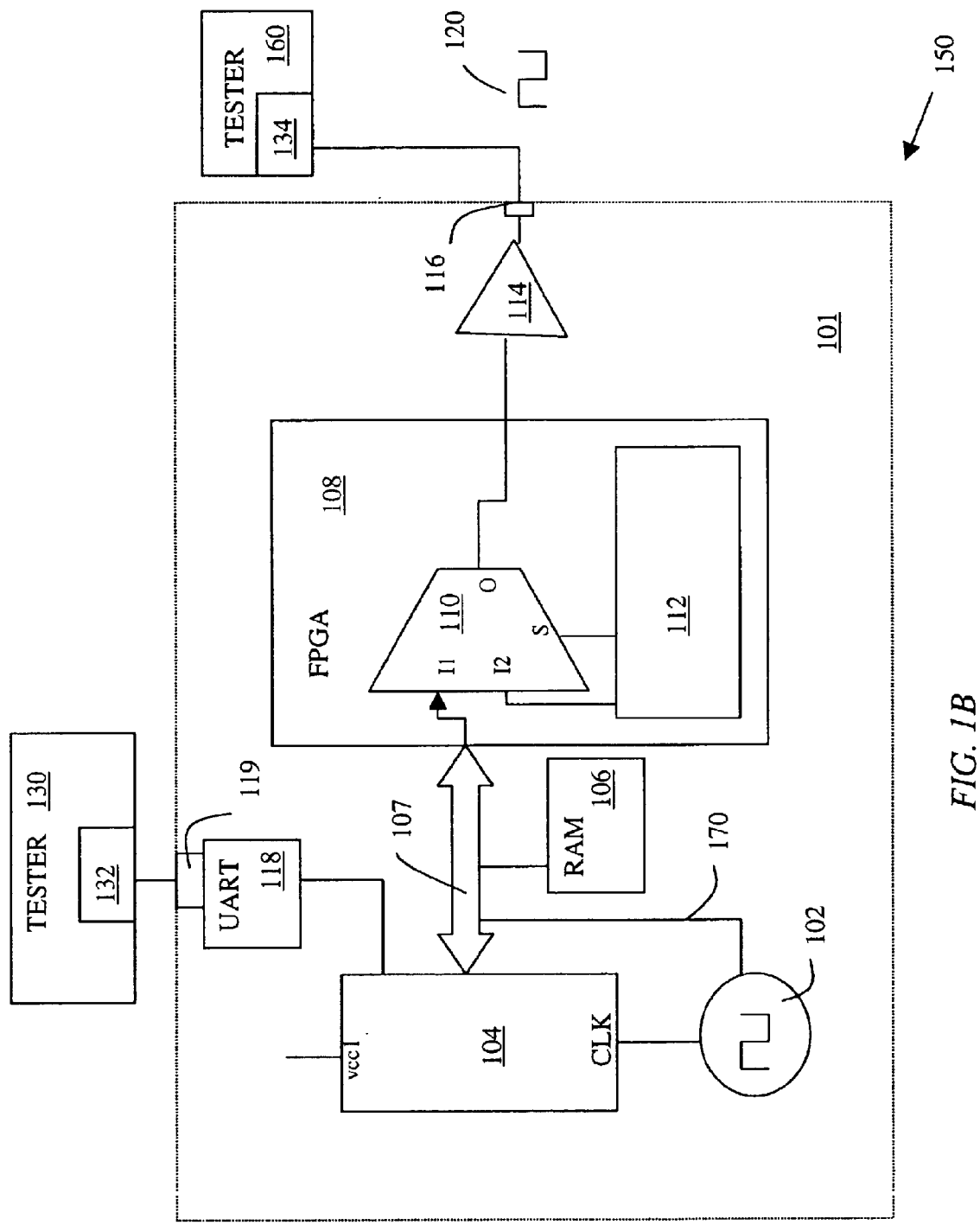
FIG. 1B is a block diagram of a testing system according another embodiment of the present invention.

The tester 130 of the embodiment of FIG. 1A includes a tester function 132 and a measuring device 134. The tester function 132 provides a test signal, containing the test instructions, to the UART port 118. The measuring device 134 is adapted to measure the frequency of a clock signal and, in this embodiment, is selectively coupled to measure the frequency of the clock signal 120 off access port 116. In other embodiments a separate different tester is used to measure the frequency. In further embodiments the oscillator is coupled directly to a FPGA. In these embodiments, a clock signal passes directly from the oscillator to a multiplexer in the FPGA and then to an external port under the control of a microprocessor. An example of an embodiment in which the clock signal passes directly from the oscillator 102 to MUX 110 in the FPGA 108 is illustrated in FIG. 1B. The testing system 150 of FIG. 1B is similar to the testing system 100 of FIG. 1A except, as illustrated, connection 170 connects the oscillator 102 to the system bus 107. The system bus 107 is coupled to MUX 110 in the FPGA. FIG. 1B also illustrates, an embodiment where the measuring device 134 is in a different tester 160 than the tester 130 that contains the tester function 132.

Figure 2:
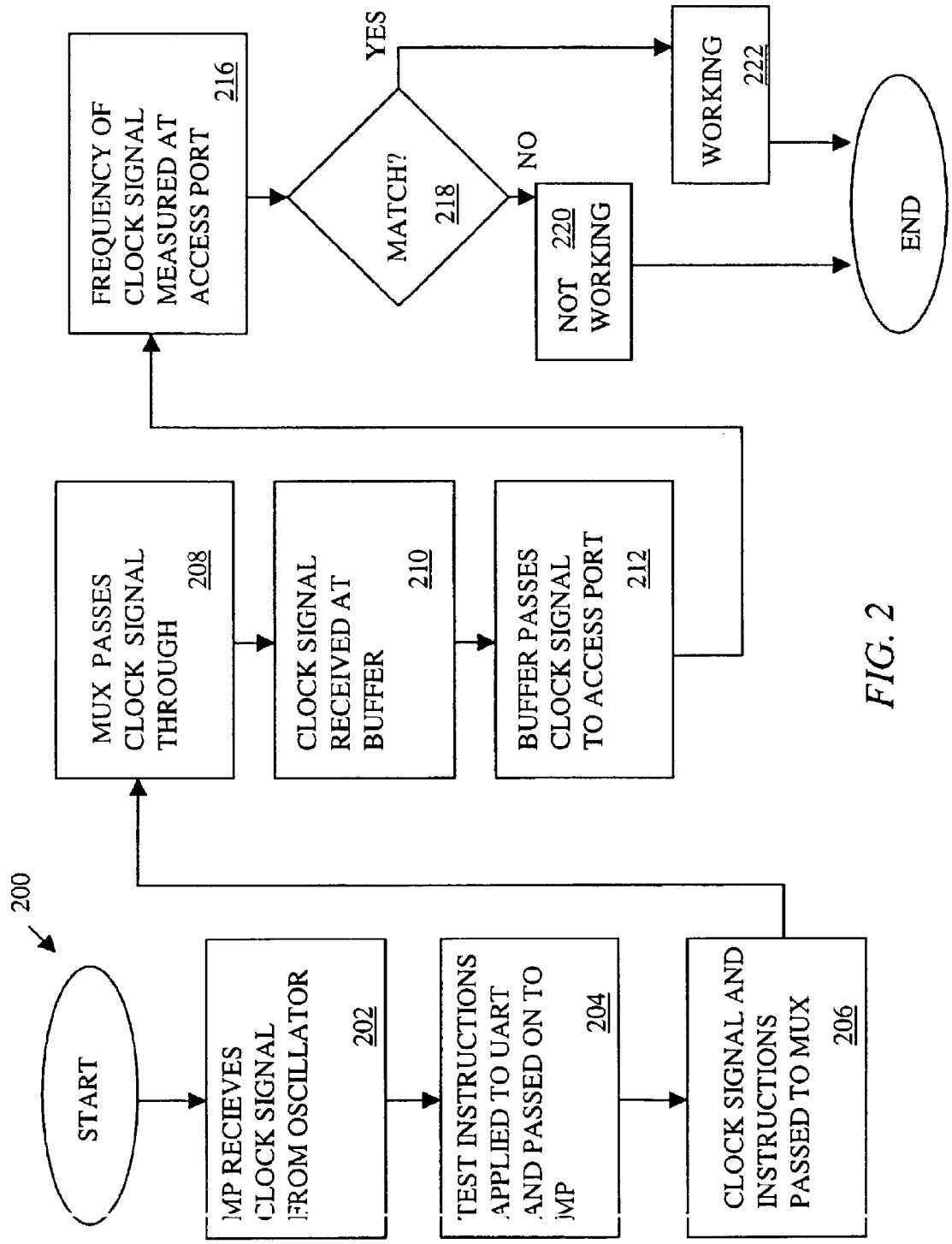
FIG. 2 is a flow chart illustrating the implementation of one embodiment of a method of the present invention.

Referring to FIG. 2, flow chart 200 illustrates a method of use for one embodiment of the present invention. As flow chart 200 illustrates, the method starts by applying power to the oscillator 102 that supplies the clock signal to the microprocessor 104 (202). The tester applies test instructions to the UART 118 which are passed on to the microprocessor 104 (204). The test instructions direct the microprocessor 104 to enter into a test mode. Once in the test mode, the microprocessor 104 passes the clock signal from the oscillator 102 along with operation instructions to the MUX 110 in the FPGA 108 via the system bus 107 (206). In response to the operation instructions received, the MUX 110 multiplexes the clock signal to buffer 114 (208). The buffer 114 then passes the clock signal on to the access port 116 (212). The frequency of the clock signal is measured at access port 116 (216). If the frequency of the clock signal matches an expected frequency (218), the oscillator 102, as well as other electronic devices in the clock signal path, are verified as working (222). If the frequency of the clock signal does not match an expected frequency (218), the oscillator 102 is not verified as working properly (220).

Although specific embodiments have been illustrated and described herein, it will be appreciated by those of ordinary skill in the art that any arrangement, which is calculated to achieve the same purpose, may be substituted for the specific embodiments shown. This application is intended to cover any adaptations or variations of the present invention. Therefore, it is intended that this invention be limited only by the claims and the equivalents thereof.

What is claimed is:

1. A method of testing an oscillator on a circuit board, the method comprising:

powering the oscillator;

providing test instructions to a microprocessor on the circuit board to place the microprocessor in a test mode;

receiving a clock signal from the oscillator at a multiplexer in a field programmable gate array;

receiving operating instructions at the multiplexer from the microprocessor;

multiplexing the clock signal to an external access port with the multiplexer in response to the operating instructions; and measuring the frequency of the clock signal at the external access port.

2. The method of claim 1, wherein providing test instructions to the microprocessor further comprises:

initiating the test instructions with an external tester; and transmitting the test instructions in a test signal to a universal asynchronous receiver/transmitter (UART) on the circuit board, wherein the microprocessor is coupled to receive the test instructions from the UART.

3. The method of claim 1, further comprising:

running the microprocessor with the clock signal; and passing the clock signal to the multiplexer during the test mode.

4. The method of claim 1, further comprising:

passing the test signal through a buffer coupled to the external access port.

5. The method of claim 1, wherein measuring the frequency of the clock signal at the access port further comprises:

coupling an external tester to the external access port to measure the frequency of the clock signal.

6. The method of claim 1, further comprising:

comparing the frequency of the clock signal with an expected frequency; and when the frequency of the clock signal matches the frequency of the expected frequency, verifying the oscillator is working properly.

7. A method for testing a signal generator for a circuit on a circuit board, the method comprising:

powering the signal generator in the circuit;

initiating a test mode for the circuit by providing test instructions to a microprocessor on the circuit board;

in the test mode, selectively passing a signal from the signal generator to a port of the circuit; and testing the signal at the port by comparing the frequency of the signal with an expected frequency.

8. A method of testing electronic devices on a circuit board with a clock signal, the method comprising:

coupling a clock signal to a microprocessor;

coupling a test signal to the microprocessor;

passing operation instructions and the clock signal to a multiplexer in response to the test signal;

multiplexing the clock signal through the multiplexer to an external access port in response to the operation instructions; and measuring the frequency of the clock signal at the external access port.

9. The method of claim 8, further comprising:

when the frequency of the clock signal at the external access port matches an expected frequency, verifying the electronic devices in the clock signal path are working properly.

10. The method of claim 8, further comprising:

generating the clock signal with an oscillator on the circuit board.

11. The method of claim 8, further comprising:

passing the clock signal through a buffer to the external access port.

12. The method of claim 8, further comprising:

creating test instructions with an external tester; and transmitting the test instructions in the test signal to a universal asynchronous receiver/transmitter (UART) on the circuit board, wherein the microprocessor is coupled to receive the test signal from the UART.

13. A tester for testing an oscillator on a circuit board, the tester comprising:

a tester function adapted to transmit a test signal containing test instructions to a microprocessor on the circuit board, wherein the test instructions instruct the microprocessor to pass a clock signal formed by the oscillator to a multiplexer and to further instruct the multiplexer to multiplex the clock signal to an external access port, and a measuring device adapted to measure the frequency of the clock signal at the external access port.

14. The tester of claim 13, wherein the tester is adapted to selectively transmit the test signal to a universal asynchronous receiver/transmitter (UART) port on the circuit board.

15. The tester of claim 13, wherein the tester is further adapted to compare the frequency of clock signal with a known frequency in determining if the oscillator is properly working.

16. The tester of claim 15, further wherein if the frequency of the clock signal matches the frequency of the known frequency the microprocessor and multiplexer are also verified as working.

17. A circuit board testing system, the testing system comprising:

an external tester adapted to generate test instructions;

a circuit board comprising, a microprocessor selectively coupled to receive the test instructions from the external tester, wherein the microprocessor goes into a test mode upon receiving the test the test instructions from the external tester, an oscillator to provide a clock signal, a field programmable array (FPGA) to provide operational functions of the circuit board, and a multiplexer contained in the FPGA, the multiplexer is coupled to receive the clock signal, the multiplexer is further coupled to receive operational instructions from the microprocessor when the microprocessor is in the test mode, wherein the multiplexer multiplexes the clock signal to an external access port in response to receiving the operational instructions from the microprocessor; and a measuring device selectively coupled to the external access port to measure the frequency of the clock signal at the external access port, wherein if the frequency of the clock signal at the external access port matches an expected frequency the oscillator is verified as working properly.

18. The testing system of claim, 17, wherein the circuit board further comprises:

an universal asynchronous receiver/transmitter (UART) port adapted to receive test instructions from the external tester; and an UART coupled to the UART port, the UART is further coupled to the microprocessor to pass the test instructions to the microprocessor.

19. The testing system of claim 17, wherein the microprocessor is coupled to receive the clock signal and further wherein the microprocessor passes the clock signal to the multiplexer when in the test mode.

20. The testing system of claim 17, wherein the circuit board further comprises:

a buffer coupled between the multiplexer in the FPGA and the external access port, the clock signal is passed through the buffer to the external access port during the test mode.

21. The circuit board of claim 17, wherein the measuring device is part of the external tester.

22. An electronic module with testing functionality, the electronic module comprising:
- a microprocessor adapted to receive test instructions from an external tester, wherein the microprocessor goes into a test mode upon receiving the test instructions from the external tester;
- a signal source coupled to the microprocessor to provide a signal;
- a functional circuit operatively coupled to the microprocessor to provide operation functions of the electronic module in non-test modes; and
- a multiplexer in contained in the functional circuit adapted to receive the signal from the microprocessor, the multiplexer is further coupled to receive operation instructions from the microprocessor when the microprocessor is in the test mode, wherein the multiplexer multiplexes the signal to an external access port in response to receiving the operational instructions from the microprocessor in test mode.

23. The electronic module of claim 22, further comprising:
- an universal asynchronous receiver/transmitter (UART) port adapted to receive the test instructions from the external tester; and
- an UART coupled to the UART port, the UART is further coupled to the microprocessor to pass the test instructions to the microprocessor.

24. The testing system of claim 22, wherein the circuit board further comprises:
- a buffer coupled between the multiplexer and the external access port, wherein the signal is passed through the buffer to the external access port during the test mode.

\* \* \* \* \*

UNITED STATES PATENT AND TRADEMARK OFFICE
CERTIFICATE OF CORRECTION

PATENT NO. : 6,898,543 B2  
APPLICATION NO. : 10/201512  
DATED : May 4, 2005  
INVENTOR(S) : Espinoza et al.

Page 1 of 1

It is certified that error appears in the above-identified patent and that said Letters Patent is hereby corrected as shown below:

At Claim 7, Column 5, Line 35, please replace "for" with --in--

At Claim 17, Column 6, Line 36, please delete the first occurrence of "the test"

Signed and Sealed this

Seventeenth Day of June, 2008

JON W. DUDAS  
*Director of the United States Patent and Trademark Office*

UNITED STATES PATENT AND TRADEMARK OFFICE
CERTIFICATE OF CORRECTION

PATENT NO. : 6,898,543 B2
APPLICATION NO. : 10/201512
DATED : May 24, 2005
INVENTOR(S) : Espinoza et al.

It is certified that error appears in the above-identified patent and that said Letters Patent is hereby corrected as shown below:

At Claim 7, Column 5, Line 35, please replace "for" with --in--

At Claim 17, Column 6, Line 36, please delete the first occurrence of "the test"

This certificate supersedes the Certificate of Correction issued June 17, 2008.

Signed and Sealed this

Fifteenth Day of July, 2008

JON W. DUDAS
*Director of the United States Patent and Trademark Office*